United States Patent
Itriago Leon et al.

(10) Patent No.: US 10,649,055 B2
(45) Date of Patent: May 12, 2020

(54) METHOD AND APPARATUS FOR DIFFUSION-WEIGHTED MAGNETIC RESONANCE IMAGING

(71) Applicant: Siemens Healthcare GmbH, Erlangen (DE)

(72) Inventors: Pedro Miguel Itriago Leon, Caracas (VE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 489 days.

(21) Appl. No.: 15/415,122

(22) Filed: Jan. 25, 2017

(65) Prior Publication Data

US 2017/0212199 A1 Jul. 27, 2017

(30) Foreign Application Priority Data

Jan. 25, 2016 (DE) .................. 10 2016 200 975

(51) Int. Cl.
  *G01R 33/563* (2006.01)
  *G01R 33/56* (2006.01)
  *G01R 33/483* (2006.01)
  *G01R 33/54* (2006.01)
  *G01R 33/565* (2006.01)

(52) U.S. Cl.
  CPC ... *G01R 33/56341* (2013.01); *G01R 33/4835* (2013.01); *G01R 33/543* (2013.01); *G01R 33/5608* (2013.01); *G01R 33/56581* (2013.01)

(58) Field of Classification Search
  CPC .............. G01R 33/543; G01R 33/5608; G01R 33/56341; G01R 33/385; G01R 33/4835; G01R 33/56581
  See application file for complete search history.

(56) References Cited

U.S. PATENT DOCUMENTS

| | | | |
|---|---|---|---|
| 8,405,395 B2 | 3/2013 | Setsompop et al. | |
| 2008/0024131 A1* | 1/2008 | Wedeen | G01R 33/5617 324/309 |
| 2013/0033262 A1 | 2/2013 | Porter | |
| 2013/0278257 A1 | 10/2013 | Boada et al. | |
| 2013/0285656 A1 | 10/2013 | Feiweier | |
| 2016/0202338 A1* | 7/2016 | Kimura | G01R 33/5608 324/309 |

OTHER PUBLICATIONS

Heid, "Eddy Current-Nulled Diffusion Weighting," Proc. Intl. Soc. Mag. Reson. Med., vol. 8, p. 799 (2000).
Reese et al., "Reduction of Eddy-Current-Induced Distortion in Diffusion MRI Using a Twice-Refocused Spin Echo," Magnetic Resonance in Medicine, vol. 49, pp. 177-182 (2003).
(Continued)

*Primary Examiner* — Rishi R Patel
(74) *Attorney, Agent, or Firm* — Schiff Hardin LLP

(57) ABSTRACT

In diffusion-weighted magnetic resonance imaging, diffusion-encoded gradient pulses with an amplitude and a duration are activated. The amplitude and the duration of the gradient pulses are varied for various excitations of nuclear magnetization. The echo time for the various excitations of nuclear magnetization can be changed.

17 Claims, 6 Drawing Sheets

(56) References Cited

OTHER PUBLICATIONS

Meier et al., "Concomitant Field Terms for Asymmetric Gradient Coils: Consequences for Diffusion, Flow, and Echo-Planar Imaging," Magnetic Resonance in Medicine, vol. 60, pp. 128-134 (2008).
Setsompop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).
Setsompop et al., "Improving diffusion MRI using simultaneous multi-slice echo planar imaging," NeuroImage, vol. 63, pp. 569-580 (2012).
Feinberg et al., "Simultaneous Echo Refocusing in EPI," Magnetic Resonance in Medicine, vol. 48, pp. 1-5 (2002).
Stejskal et al., "Spin Diffusion Measurements: Spin Echos in the Presence of a Time-Dependent Field Gradient," The Journal of Chemical Physics, vol. 42, No. 1, pp. 288-292 (1965).
Lee et al; Effects of Equilibrium Exchange on Diffusion-Weighted NMR Signals: The Diffusigraphic "Shutter-Speed"; Magnetic Resonance in Medicine; vol. 49; pp. 450-458; (2003).
Tuch et al; "Diffusion MRI of Complex Neural Architecture"; Neuron; vol. 40; pp. 885-895; (2003).
Zur et al; "A New Diffusion SSFP Imaging Technique"; Magnetic Resonance in Medicine; vol. 37; pp. 716-722; (1997).

\* cited by examiner

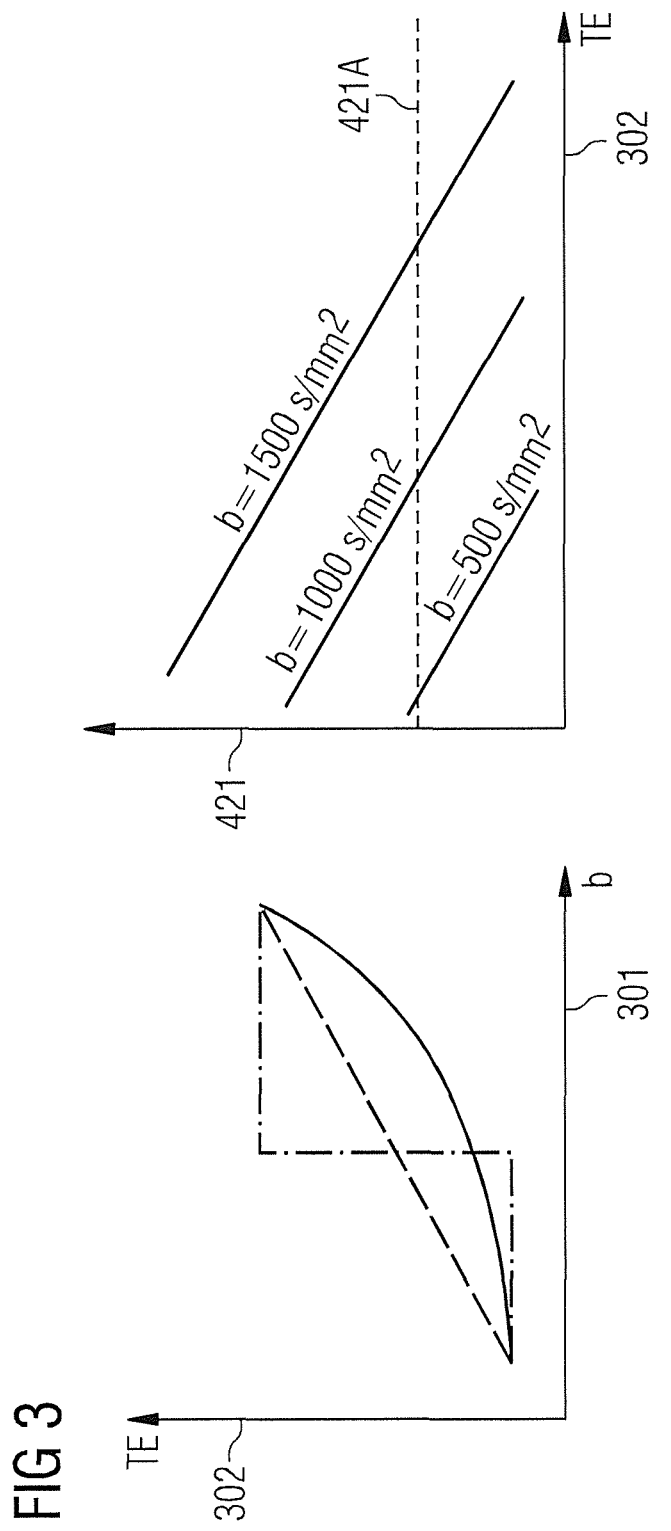

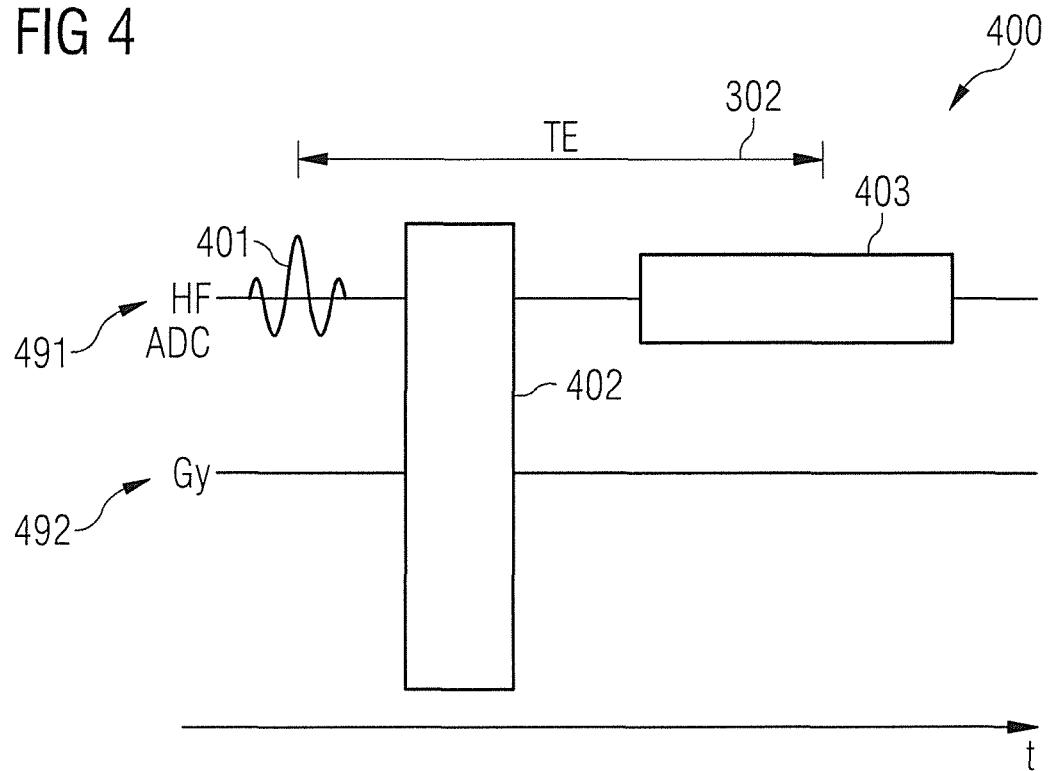
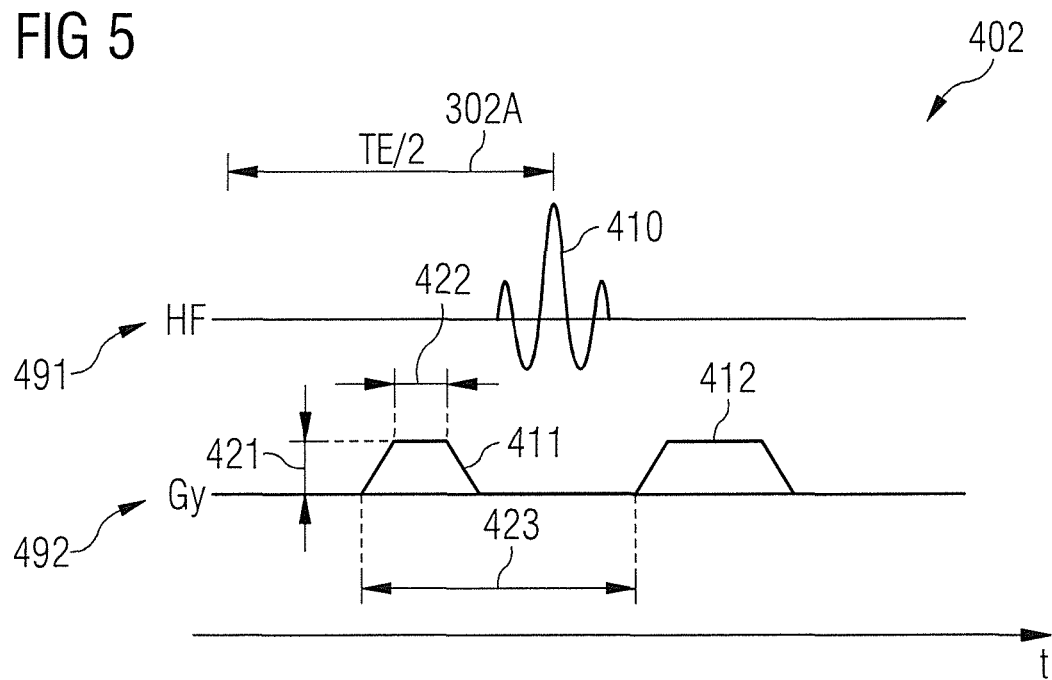

METHOD AND APPARATUS FOR DIFFUSION-WEIGHTED MAGNETIC RESONANCE IMAGING

BACKGROUND OF THE INVENTION

Field of the Invention

The present invention concerns a method that includes defining a diffusion-weighted magnetic resonance image, as well as a corresponding magnetic resonance apparatus. In particular, various embodiments relate to the variation in the amplitude and duration of diffusion-encoding gradient pulses.

Description of the Prior Art

Magnetic resonance (MR) imaging is a modality used for generating MR images based on MR data that depicts an examination subject. Typically, the examination subject, such as a person under examination, is positioned in a scanner in which a basic magnetic field is generated that is as static and as homogeneous as possible, with a field strength between 0.5 Tesla and 5 Tesla, for example. The basic magnetic field aligns the magnetization of nuclear spins the examination subject along the direction of the basic magnetic field.

Radio frequency (RF) excitation pulses are radiated into an examination region of the subject in order to deflect the nuclear magnetization from its neutral position along the direction of the basic magnetic field, that is, in order to excite nuclear magnetization. The subsequent relaxation of nuclear magnetization causes the nuclear spins to emit RF signals, known as echoes. In the context of gradient echo MR imaging or echo planar MR imaging (EPI), gradient echoes are generated, by using gradient pulses to rephase and dephase the nuclear magnetization (refocusing and dephasing gradient pulses). These can be part of a corresponding gradient pulse train, for example.

Gradient pulses can also be used for spatially encoding the MR data. The gradient pulses generate gradient magnetic fields (gradient fields), which are superimposed on the basic magnetic field.

The MR data are measured (detected) during a readout phase. The readout phase is chronologically spaced by the echo time TE against the excitation, so that the MR data are readout during one or more gradient echoes.

The acquired MR data are also referred to as raw data. The MR raw data can be processed in order to reconstruct the MR image of the examination subject. For example, the measured MR raw data are typically digitized and are initially available in the spatial frequency space (domain) (k-space). Using a Fourier transform, it is then possible to transform the MR raw data into image data in the image space, in order to generate the MR image.

A special form of MR imaging is diffusion-weighted MR imaging. In clinical routine, diffusion-weighted MR images can supply important diagnostic data, for example, in the diagnosis of strokes and tumors. Diffusion-weighted MR images contain information about the diffusion of molecules in the examination region. From the diffusion-weighting, it is possible to derive a degree of diffusion, so a quantitative statement can ensue.

In diffusion-weighted MR imaging, additional gradient fields (diffusion gradient fields) are produced in specific directions by activating corresponding diffusion-encoding gradient pulses. The diffusion gradient fields trigger the diffusion encoding of the MR data by diffusion: the diffusion of water molecules along the diffusion gradient fields typically attenuates the MR signal. In areas with a lower (higher) diffusion, a lower (higher) signal attenuation consequently typically ensues, such that, in an imaging MR measurement, these areas can have an increased (reduced) amplitude.

The degree of the diffusion weighting can be correlated with the strength of the diffusion gradient fields that are applied or with the amplitude and duration of the gradient pulses; typically stronger (weaker) diffusion gradient fields induce a higher (lower) diffusion weighting of the MR images.

The parameters of the diffusion gradient fields are often referred to a b value. b values for different gradient fields are known in relation to diffusion gradient fields and the so-called b matrix. The b matrix can describe properties of the diffusion gradient fields such as strength and/or orientation and/or duration etc.

The b matrix is determined on the basis of various b values. The b matrix is used to determine the diffusion tensor, which is a description of the degree and direction of diffusion. This can be achieved, for example, using an equation known as the Stejskal-Tanner equation. The diffusion tensor contains comprehensive information on the diffusion.

Different diffusion encodings are also possible. An example of diffusion encoding is dual bipolar diffusion encoding, cf. HEID O., "Eddy current-nulled diffusion weighting" in Proc. 8th Annual Meeting of ISMRM (2000) 799, the relevant disclosure from which is adopted here as a cross reference.

Known diffusion-weighted MR imaging techniques have certain limitations. In diffusion-weighted MR imaging, phase errors, such as slice-specific dephasing for example, may occur. This dephasing is caused by unwanted gradient fields that can occur as a consequence of the Maxwell equations. These unwanted gradient fields are also known as concomitant field terms.

Techniques for reducing phase errors due to concomitant field terms are known. For example, slice-specific and gradient-specific correction factors can be determined. These correction factors can be imprinted on the diffusion encoding by gradient pulses that have been adapted accordingly, cf. MEIER C. et al., "Concomitant Field Terms for Asymmetric Gradient Coils: Consequences for Diffusion, Flow, and Echo-Planar Imaging" in Mag. Reson. Med. 60 (2008) 128-134.

Such techniques as per MEIER C. can be complicated. In particular, it may be necessary to calculate the correction factors and adapt the gradient pulses accordingly.

Furthermore, such techniques may be useable for multi-slice MR imaging only with certain limitations. Multi-slice MR imaging is sometimes also referred to as slice multi-plexed MR imaging. In multi-slice MR imaging, the nuclear magnetization is excited in two or more slices simultaneously and the MR data are readout simultaneously (i.e. simultaneous multi-slice, SMS). Separation of the MR data into the various slices is achieved, for example, on the basis of slice-specific reconstruction using a parallel image technique (partial parallel acquisition, PPA). PPA techniques make it possible to undersample k-space and to reconstruct missing sampling points in the MR data by using a reconstruction kernel. Corresponding techniques in relation to SMS EPI are described in: SETSOMPOP K. et al., "Improving diffusion MRI using simultaneous multi-slice echo planar imaging" in NeuroImage 63 (2012) 569-580, and in U.S. Pat. No. 8,405,395; these are incorporated as a cross reference here.

Since the aforementioned correction factors are slice-specific, it is not possible, or is only possible to a limited extent, to use them in the simultaneous modification of nuclear magnetization in multiple slices. Furthermore, in the context of SMS MR imaging, efforts are typically made to select the simultaneously modified slices as broadly as possible in order to allow a good slice separation or to avoid a significant lowering of the g factor. In the context of SMS MR imaging, spaced slices are selected in order to allow the separation of the slices by varying the sensitivities of the receiving coils. The farther apart the two simultaneously excited slices are, the greater is the variation in sensitivity. The g factor describes the lowering of the signal-to-noise ratio that is caused by the coil geometry. This is occurs particularly with high acceleration factors, that is, for a large number of simultaneously modified slices, or for RF coil arrays with a low number of coil elements. Therefore, it is often the case that a good approximation of the correction factors for all the simultaneously modified slices cannot be found. This may lead to a lowering of the quality of the MR images, in particular for slices that are situated at a distance from the isocenter of the scanner.

DE 10 2012 205 587 B4 discloses techniques in which RF excitation pulses for the slices are time-delayed. As a result, it is also possible in the context of SMS MR imaging to impose slice-specific factors that allow a correction of the concomitant field terms. However, such a technique has the limitation that different RF excitation pulses have to be determined for each slice, which may be complicated. Moreover, this may lead to a significant time-lag between the excitation of the nuclear magnetization in different slices, which may reduce the quality of the MR image.

SUMMARY OF THE INVENTION

There is therefore a need for improved diffusion-weighted MR imaging techniques. In particular there is a need for techniques which remove at least some of the aforementioned drawbacks and limitations. In particular, there is a need for such techniques that make it possible to reduce or avoid phase errors caused by concomitant field terms. There is also a need for techniques that can be used in conjunction with SMS MR imaging.

An object of the invention is to address those needs.

The inventive method includes the radiation of a first RF excitation pulse to excite the nuclear magnetization in an examination region. The method further includes applying first diffusion-encoding gradient pulses to the nuclear magnetization excited by the first RF excitation pulse. The first gradient pulses have a first amplitude and a first duration. The method further includes the acquisition of first MR data for the nuclear magnetization excited by the first RF excitation pulse. The method further includes the radiation of a second RF excitation pulse to excite nuclear magnetization in the examination region. The method further includes applying second diffusion-encoding gradient pulses to the nuclear magnetization excited by the second RF excitation pulse. The second gradient pulses have a second amplitude and a second duration. The method further includes acquiring second MR data for the nuclear magnetization excited by the second RF excitation pulse. The method further includes determining a diffusion-weighted MR image based on the first MR data and the second MR data. The first amplitude is different from the second amplitude. The first duration is different from the second duration.

According to various embodiments, MR imaging is implemented by corresponding MR scanning sequences. The MR scanning sequences include the RF excitation pulses, the diffusion-encoding gradient pulses, etc.

For example, the RF excitation pulses can be 90° pulses, which means that it deflects ("flips") the nuclear magnetization by 90° with respect to the steady state produced by alignment with the basic magnetic field lines. It is also possible for the RF excitation pulses to have other flip angles. The RF excitation pulses can deflect the nuclear magnetization from the rest position parallel to the basic magnetic field. This means that the RF excitation pulses can generate a transverse component in the nuclear magnetization. The RF excitation pulses can excite nuclear magnetization in one or a number of slices in the examination region.

A wide range of techniques can be used to acquire the first MR data and the second MR data. For example, EPI MR imaging can be used. This means that refocusing and defocusing gradient pulses are radiated in order to form gradient echoes. For example, the refocusing and defocusing gradient pulses may be part of a gradient pulse train that alternately includes gradient pulses of positive and negative polarity. In a further example, a spin echo MR imaging technique, such as turbo spin echo (TSE), can be used.

The examination region can be, for example, a partial region of a person under examination. For example, the examination region may include a head region, the brain for example, of the person under examination. It may be possible, on the basis of the diffusion-weighted MR image, to determine various physiological characteristics of a substance in the examination region. The MR image can be used for example, to detect a stroke or a tumor. There is a general desire for the quality of the MR image to be as good as possible so a large depth of information is contained in the MR image, making it may possible to effect a conclusive diagnosis on the basis of the MR image. The inventive method responds to that desire.

Basically, the MR image can depict a very wide range of diffusion encoding parameters. One example is the ADC factor (apparent diffusion coefficient) in units of $mm^2/s$. The ADC factor describes the diffusion of water through different types of tissue. The ADC factor is an averaging of the diffusion over different spatial directions. A further example is to depict certain components of the diffusion tensor, describing the strength and/or direction of the diffusion.

By selecting different amplitudes and durations of the diffusion-encoding gradient pulses for the first and second MR data, it may be possible to select amplitudes and durations of the diffusion-encoding gradient pulses in a flexible manner. In particular it is possible to select comparatively low amplitudes, for example, compared with the reference values. Lower amplitudes of the gradient pulses may make it possible to reduce the concomitant field terms. As a result, it is possible to reduce distortions in the MR data, so the quality of the MR image is enhanced.

Depending on the type of information to be contained in the diffusion coded MR image, it may be necessary to acquire different MR data or to implement different diffusion encodings. In particular, it may be necessary to produce different b values by appropriate selection of the diffusion-encoding gradient pulses. The b value is proportional to a factor imposed by the diffusion-encoding gradient pulses; this factor in turn is proportional to the product of the amplitude and the duration of the diffusion-encoding gradient pulses.

In various examples it is possible for the first MR data and the second MR data to be acquired in the context of different repetitions of the MR scanning sequence. If this is done, it is possible for the different repetitions to correspond to different b values. The first gradient pulses can encode a first b value and the second gradient pulses can encode a second b value, the first b value being different from the second b value. This means that the factor in the first gradient pulses differs from the factor in the second gradient pulses is.

By selecting different amplitudes and durations of the gradient pulses for different b values, it is possible for a reduction of the concomitant field terms to be achieved even for high b values—which require high factors and hence typically high amplitudes. For example, a reduction in the concomitant field terms can even be achieved for b values in the region of more than 500 s/mm$^2$, or more than 1000 s/mm$^2$, or more than 2000 s/mm$^2$.

In further examples, the first MR data are acquired in a first echo time produced by the first RF excitation pulse and the second MR data are acquired in a second echo time produced by the second RF excitation pulse. The first echo time may differ from the second echo time.

For example, the echo time may be defined as the time lag between the temporal center of the RF excitation pulse and the acquisition of the MR data for the central region in k-space. However, other definitions of the echo time are also conceivable.

For instance, longer (shorter) echo times may allow longer (shorter) durations of the gradient pulses. By varying the echo time, it is therefore possible for a further degree of freedom to be implemented in the determination of parameters of the MR scanning sequence for the acquisition of the first and second MR data. In particular, by varying the echo time, it may be possible to achieve a greater freedom in the determination of the amplitude and duration of the gradient pulses.

For example, it may be possible for the first echo time to be shorter than the second echo time. Then the first gradient pulses encodes a b value that is lower than the b value encoded by the second gradient pulses.

As a result of extending the selection of the second echo time, a longer duration of the second gradient pulses is facilitated; this in turn allows a comparatively lower amplitude of the second gradient pulses to be selected without changing the factor or the b value encoded by the second gradient pulses. This means that, by extending the echo time, in particular for high b values, the amplitude of the corresponding gradient pulses can be limited. As a result, the associated higher-order field terms can be reduced compared with the reference values, in which no limitation of the amplitude of the corresponding gradient pulses due to an extended echo time is implemented.

Different qualitative and quantitative relationships of the echo times to the b values are conceivable. For example, it would be possible for the first echo time to be from 70% to 95% of the second echo time, preferably from 80% to 90%. For example, the first echo time could be around 85% of the second echo time.

This means that the second echo time can be extended significantly compared with the first echo time. As a result, flexibility in extending the duration of the second gradient pulse is achieved, which in turn allows the amplitude of the second gradient pulse to be reduced without changing the factor transmitted or the encoded b value.

Extending the echo time typically leads to a reduced signal strength in the corresponding MR data. This is the case because the relaxation in the nuclear magnetization has moved further into the neutral position. The relaxation in the nuclear magnetization is typically described by the T2 relaxation time. The relaxation in the nuclear magnetization typically follows an exponential relationship, with the T2 relaxation time determining the exponent, that is, the degree of relaxation.

In an embodiment, the method further includes reducing differences in the signal strength of the first MR data and of the second MR data due to the different echo times. Reducing the differences can correspond with a compensation or standardization to a specified reference echo time. As a result, the presence of significant distortions in the MR image due to the echo times being selected differently is avoided.

For example, the reduction can be based on a ratio between firstly, a difference between the first echo time and the second echo time and, secondly, the relaxation time. The reduction can take into account for example, the aforementioned exponential relationship. In this way, a particularly precise compensation of the different signal strengths can be achieved.

A wide range of techniques are conceivable for determining the relaxation time. In a simple implementation, the relaxation time can be predetermined. For example, the relaxation time can be predetermined as a function of the type of examination region. Depending on the type of substance in the examination region, different relaxation times can be predetermined for example; for instance, different relaxation times can be selected for the following types of substance: fat; water; tissue; air. By presetting the relaxation time, a simple and fairly straightforward reduction in the differences in the signal strength can be achieved.

In further embodiments, the relaxation time can be determined on the basis of reference MR scans that are carried out for different echo times. For example, the relaxation time can be determined empirically by adjusting a curve on the basis of the model of an exponential relaxation to the signal strengths of the MR data from the reference MR scans. This may allow a particularly precise determination of the relaxation time and hence allow a compensation of the differences in signal strength.

In other embodiments, a reduction in the differences in the signal strength can be made in a slice-specific manner for a number of slices in the examination region, and/or to be made in a spatially resolved manner for different positions in the examination region. Such techniques are based on the knowledge that the type of substance and hence the relaxation time may vary in different slices or at different positions in the examination region. The spatially resolved compensation can include, for example, defining the relaxation time differently for different pixels in the MR data. In this way, the reduction in the differences in the signal strength can be carried out in a particularly precise manner.

A wide range of techniques can be used for the diffusion encoding. For example, the first gradient pulses and the second gradient pulses can trigger a dual bipolar diffusion encoding. In such a case, the first gradient pulses can include two positive gradient pulses and two negative gradient pulses, that is, two gradient pulses with positive polarity and two gradient pulses with negative polarity. Accordingly, the second gradient pulses can include two positive gradient pulses and two negative gradient pulses.

In other examples, the first gradient pulses and the second gradient pulses can trigger a Stejskal-Tanner diffusion encoding, see STEJSKAL E. O. and TANNER J. E. "Spin Diffusion Measurements: Spin Echoes in the Presence of Time-Dependent Field Gradient" in J. Chem. Phys. 42 (1965) 288.

For example, it is possible for the first RF excitation pulse and the second RF excitation pulse to each excite nuclear magnetization simultaneously in a number of slices from the examination region. Then it is possible for the first MR data and the second MR data to be acquired in each case for the plurality of slices.

For example, the MR scanning sequence can be executed as SMS MR imaging. By such techniques, it is possible to reduce the duration of the scan.

By the simultaneous excitation and/or generation of gradient echoes for the acquisition of the MR data, the MR data are typically superimposed or collapsed for the slices. The method can further include separation of the first and/or second MR data to obtain slice-specific MR data for each of the slices.

A PPA technique can be used to separate or collapse the first and/or second MR data for the slices, which uses a slice-specific reconstruction kernel for each of the slices. Accordingly, the method can further include separation of the MR data based on slice-specific reconstruction kernels in a PPA technique. The separation of the MR data on the basis of slice-specific reconstruction kernels typically relies on the MR calibration data for the reconstruction kernels having been acquired using a specific phase encoding, which is also used for the MR data.

A set of slice-specific reconstruction kernels for the slices can be determined during a calibration phase, for example. Such a calibration phase can include the execution of a calibration scanning sequence. For example, the calibration scanning sequence can include radiating at least one RF excitation pulse, which excites nuclear magnetization in the first slices of the examination subject. For example, the calibration scanning sequence can include using at least one phase-encoded gradient pulse train for the sequential generation of gradient echoes of the nuclear magnetization excited by the RF excitation pulse. For example, the calibration scanning sequence can include the measurement of the gradient echoes as calibration MR data. On the basis of the calibration MR data, it may then be possible to determine the slice-specific reconstruction kernels for each of the slices. In particular, it may be possible that the calibration MR data for each of the slices sample k-space with a higher resolution than the MR data, that is, that there is no undersampling.

With respect to the simultaneous acquisition of MR data for example, in the context of SMS MR imaging, the techniques disclosed herein offers special advantages. For example, unlike the reference implementations, which are based on correction factors imprinted in a slice-specific manner, it can be a more straightforward procedure to implement the simultaneity with respect to a plurality of slices. In particular, it is not necessary to define slice-specific correction factors, nor is it necessary to use slice-specific correction factors by appropriate switching on of gradient pulses—which not may be possible anyway, or only to a limited extent, in the case of simultaneous excitation or simultaneous acquisition of MR data.

A magnetic resonance apparatus in accordance with the invention has an MR data acquisition scanner with an RF radiator and an RF receiver and a gradient system, and at least one processor. The at least one processor is configured to cause the RF radiator to radiate a first RF excitation pulse to excite nuclear magnetization in an examination region. The at least one processor is further configured to operate the gradient system to apply first diffusion-encoding gradient pulses to the nuclear magnetization excited by the first RF excitation pulse, the first gradient pulses having a first amplitude and a first duration. The at least one processor is further configured to operate the RF receiver and the gradient system to acquire first MR data for the nuclear magnetization excited by the first RF excitation pulse. The at least one processor is further configured to operate the RF radiator to radiate a second RF excitation pulse to excite nuclear magnetization in the examination region. The at least one processor is further configured to operate the gradient system to apply second diffusion-encoding gradient pulses to the nuclear magnetization excited by the second RF excitation pulse. The second gradient pulses have a second amplitude and a second duration. The at least one processor is further configured to operate the RF receiver and the gradient system to acquire second MR data for the nuclear magnetization excited by the second RF excitation pulse. The at least one processor is further configured to define a diffusion-weighted MR image based on the first MR data and the second MR data. The first amplitude differs from the second amplitude. The first duration differs from the second duration.

The MR apparatus in accordance with the invention thus is designed in order to implement the method in accordance with the present invention.

With such an MR apparatus, results and advantages are achieved that are comparable to those achieved by the method according to the present invention.

The RF radiator and the RF receiver can use the same or different RF coils or antennas for the respective radiation and detection of RF energy.

The present invention also encompasses a non-transitory, computer-readable data storage medium encoded with programming instructions (program code) that, when the storage medium is loaded into a computer or computer system of a magnetic resonance apparatus, cause the computer or computer system to operate the magnetic resonance apparatus so as to implement any or all of the embodiments of the method described above.

The features described above and below can be used not only in the combinations that are explicitly described, but also in other combinations or individually.

BRIEF DESCRIPTION OF THE DRAWINGS

FIG. 3 illustrates the acquisition of MR data at various echo times according to various embodiments of the invention, wherein the echo time is selected as a function of the b value, and FIG. 3 further illustrates the amplitude of diffusion-encoding gradient pulses as a function of the echo time.

FIG. 4 is a sequence diagram for an MR scanning sequence for the acquisition of diffusion-weighted MR data according to various embodiments of the invention, wherein the MR scanning sequence includes a diffusion encoding module.

FIG. 5 is a sequence diagram that illustrates the diffusion encoding module according to various embodiments of the invention, with Stejskal-Tanner diffusion encoding.

DESCRIPTION OF THE PREFERRED EMBODIMENTS

Figure 1:
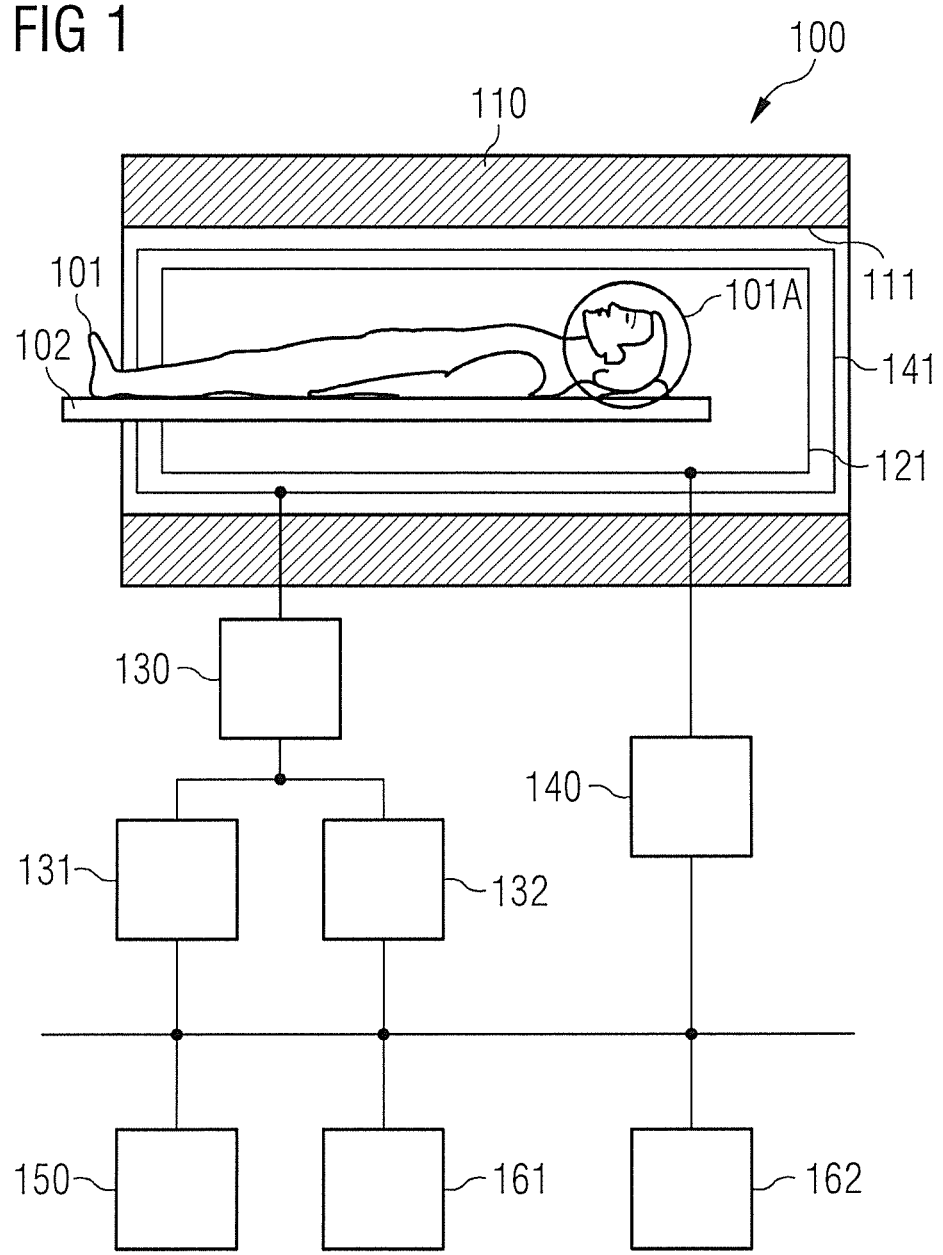
FIG. 1 schematically illustrates an MR apparatus in accordance with the invention.

The present invention is described hereinafter using preferred embodiments and with reference to the drawing. In the figures, the same reference signs denote elements that are identical or similar. The figures are schematic representations of various embodiments of the invention. Elements shown in the figures are not necessarily true to scale. It is the case, rather, that the various elements depicted in the figures are reproduced in such a way that their function and general purpose is comprehensible to a person skilled in the art. Combinations and couplings between functional units and elements depicted in the figures can also be implemented as an indirect combination or coupling. A combination or coupling can be implemented in a wired or wireless manner. Functional units can be implemented as hardware, software or as a combination of hardware and software.

Hereinafter, techniques are described that make it possible to reduce negative effects due to concomitant field terms, which represent deviations from a linear path of diffusion-encoding gradient fields. In various examples, in particular the dephasing of the nuclear magnetization, and phase errors resulting therefrom can be reduced.

Such techniques can be used in connection with diffusion-weighted SMS MR imaging, in which the techniques—despite the simultaneous modification of the nuclear magnetization in a number of slices—make it possible to achieve a targeted reduction in negative effects of the concomitant field terms.

In further examples it is also possible, however, to use such techniques in conjunction with diffusion-weighted single-slice imaging, in which MR data are not acquired simultaneously for different slices.

The MR imaging can use a TSE or EPI technique, for example. The type of MR imaging is immaterial with the techniques described herein.

Various examples of the techniques described here are based on the selection of different echo times for different diffusion encoding b values, it being possible in exemplary implementations to acquire higher (lower) b values with longer (shorter) echo times; the longer (shorter) echo times allow (require) lower (higher) amplitudes for the diffusion-encoding gradient pulses.

Such techniques are based on the knowledge that the concomitant field terms typically show a quadratic relationship with the amplitudes of the gradient fields or with the amplitude of the gradient pulses that are generating the gradient fields. Here, a short echo time for high b values limits the time span available for the diffusion-weighting gradient pulses; therefore, to achieve high b values in reference implementations, a comparatively high amplitude of the gradient pulse has to be selected. This in turn leads to larger gradient fields and hence to more pronounced concomitant field terms, which reduces the quality of the MR imaging.

Such techniques may be based on the further realization that by extending the echo time for high b values, the time span available for the diffusion-encoding gradient pulses can be extended; as a result, the amplitude of the gradient pulse that is selected can be lower, as a result of which in turn smaller gradient fields and hence weaker concomitant field terms can be achieved.

Such techniques are based on the further knowledge that global extension of the echo time for all the b values may be less desirable. This is the case since, in order to reduce T2 effects (T2 shine-through effects), which can be triggered by surfaces with a reduced signal, short echo times are basically desirable. In the examples, shorter echo times are therefore selected for low b values, than for high b values.

In various examples, furthermore, influences of the different echo times on the MR image are reduced. For this purpose, a relaxation time that describes the decline in the signal strength of the MR data can be set, for example, or defined by a reference MR scan. The relaxation time can be determined, for example, in a time-resolved manner and/or in a slice-specific manner.

FIG. 1 illustrates in schematic form an MR apparatus 100, which can be used to implement the aforementioned techniques and the techniques described below. The MR apparatus 100 has a scanner 110, which defines a tube 111. The scanner 110 generates a basic magnetic field that is parallel with its longitudinal axis.

An examination subject, here a person 101 under examination, can be moved on a couch 102 into the scanner 110. In the example in FIG. 1, an examination region 101A is situated in the region of the head of the person 101 under examination.

The scanner 110 further has a gradient system 140 to generate gradient fields that are used for MR imaging and for the spatial encoding of acquired MR data. The gradient system 140 typically includes at least three gradient coils 141 that can be activated separately and that are positioned in a well-defined manner with respect to one another. The gradient coils 141 make it possible to apply gradient pulses that generate the gradient fields along certain spatial directions (gradient axes). The gradient fields can be used, for example, for slice selection, for frequency encoding (in the readout direction) and for phase encoding. As a result, a spatial encoding of the MR data can be achieved. The gradient fields can also be used for the diffusion encoding.

Typically, the goal is to achieve gradient fields that vary in a linear manner as a function of position. Since such linear gradient fields do not represent a solution to the Maxwell equations, the concomitant field terms appear. These lead to a deviation from the linearity of the gradient fields. Concomitant field terms may occur in particular in conjunction with an asymmetrical design of the gradient coils 141, cf. MEIER C. et al. "Concomitant Field Terms for Asymmetric Gradient Coils: Consequences for Diffusion, Flow, and Echo-Planar Imaging" in Mag. Reson. Med. 60 (2008) 128-134. For Stejskal-Tanner diffusion encoding, deviations from the desired amplitude of the gradient fields occur; this leads to a distortion in the b value. For dual bipolar diffusion encoding, a phase error can occur due to additional dephasing, since factors, that are triggered by gradient pulses of different polarity are no longer compensated.

In a first approximation, the concomitant field terms show a quadratic dependence on the amplitude of the gradient fields and a linear dependence on the distance of the spatial domain from the magnetic isocenter of the basic magnetic field. Furthermore, the concomitant field terms are in inverse proportion to the strength of the basic magnetic field. The concomitant field terms are therefore stronger in the case of comparatively small basic magnetic fields (of for example, 1.5 Tesla). Likewise, the concomitant field terms are stronger at high amplitudes of the diffusion-encoding gradient pulses, that is, at high b values. Moreover, the concomitant field Willis are stronger in slices that are located further from the isocenter.

To excite the polarization or orientation of nuclear magnetization in the longitudinal direction, resulting in the basic magnetic field, an RF coil arrangement 121 is provided that radiates an amplitude-modulated and/or frequency-modulated RF excitation pulse into the person 101 under examination. As a result, a transverse magnetization of certain nuclear spins can be generated. The flip angle of the RF excitation pulse defines the degree of deflection. To generate such RF excitation pulses, an RF transmission unit 131 is connected to the RF coil arrangement 121 via an RF switch 130. The RF transmission unit 131 includes an RF generator and an RF amplitude modulation unit. The RF excitation pulses can flip the transverse magnetization 1d in a slice-selective manner or spatially-selectively in 2D/3D or globally from the steady state position.

Furthermore, an RF receiving unit 132 is coupled with the RF coil arrangement 121 over the RF switch 130. Over the RF receiving unit 132, MR signals for the relaxing transverse magnetization can be acquired as MR data, by inductive coupling into the RF coil arrangement 121.

In general it is possible to use separate RF coil arrangements 121 for radiating the RF excitation pulses by the RF-transmission unit 131 and for the acquisition of the MR data by the RF-receiving unit 132. For example, a large capacity coil 121 can be used for radiating RF pulses and for the acquisition of raw data, it is possible to use a surface coil (not shown), consisting of an array of RF coils. For example, the surface coil for the acquisition of the raw data can have thirty-two individual RF coils and can therefore be particularly suitable for PPA techniques. Suitable techniques are known to those skilled in the art, such that further details are not necessary herein.

The MR apparatus 100 further has an operating unit 150, which can include, for example, a screen, a keyboard, a mouse, etc. By means of the operating unit 150, user input can be captured and an output to the user can be implemented. For example, it may be possible for individual modes of operation or operating parameters to be set by the user and/or automatically and/or by remote control using the operating unit 150 of the MR apparatus 100.

Furthermore, the MR apparatus 100 have a sequence control computer 161. The sequence control computer 161 can be designed to activate the various components 131, 132, 140 in order to execute a scanning sequence. Typically, the implementation of the scanning sequence includes the excitation and modification of nuclear magnetization and subsequent measurement of the data. The sequence control computer 161 can be configured to carry out an EPI MR scanning sequence, for example, an SMS EPI MR scanning sequence. In particular, the sequence control computer 161 can be configured to carry out a number of repetitions of the MR scanning sequence, in order to generate different diffusion encodings for different b values. The sequence control computer 161 can be configured to apply different diffusion encodings, for example, Stejskal-Tanner coding or dual bipolar diffusion encoding.

The MR apparatus 100 also has a processor 162. The processor 162 can be configured to generate an MR image on the basis of the MR data. In particular, the processor 162 can be equipped to carry out different techniques in the context of the diffusion-weighted MR imaging, for example, the determination of the b value, the definition of the b matrix, the definition of an ADC coefficient, etc.

Whereas in the example in FIG. 1, the processor 162 and the sequence control computer 161 are illustrated as separate units, it may be possible in various examples for the sequence control computer 161 and the processor 162 to be at least partly implemented together. For example, the functionality of the sequence control computer 161 can be implemented as software on a processor.

Figure 2:
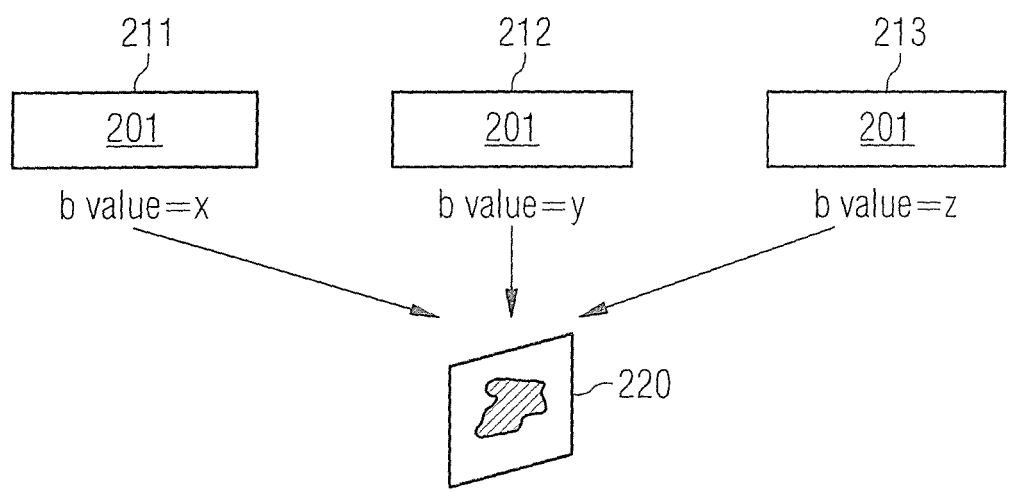
FIG. 2 schematically illustrates the implementation of multiple repetitions in a diffusion-weighted MR scanning sequence according to various embodiments of the invention, wherein the various repetitions encode different b values, and FIG. 2 further illustrates the defining of a diffusion-weighted MR image based on MR data that has been acquired in the context of the various repetitions.

FIG. 2 illustrates aspects of executing a number of repetitions in an MR scanning sequence 201 in order to acquire the respective MR data 211, 212, 213. An MR image 220 is defined (reconstructed) based on a combination of the acquired MR data 211, 212, 213. The MR image 220 is diffusion-weighted. For this purpose, the MR scanning sequence includes a diffusion-encoding diffusion module, which includes, for example, one or more refocusing pulses and two or more diffusion-encoding gradient pulses (not shown in FIG. 2).

For example, it would be possible for all the MR data 211, 212, 213 for an image of the entire examination region 101A to be measured in each repetition of the MR scanning sequence 201, that is, all the slices in the examination region 101A are sampled. In various examples, it is also possible for only a fragment of all the slices in the examination region 101A to be measured in each repetition, for example, 2 or 3 or 4 slices. Then consecutive repetitions can depict different slices.

In the different repetitions, alternatively or additionally, other MR parameters can also be varied. For example, for different repetitions, a different preparation of nuclear magnetization could be used in each case, for instance in conjunction with diffusion-weighted MR imaging. For example, in conjunction with diffusion-weighted MR imaging, the encoded diffusion direction could be varied from repetition to repetition. For example, in conjunction with diffusion-weighted MR imaging, the b value encoded by at least one diffusion gradient pulse can be varied (as indicated in FIG. 2).

The b value is typically defined by (see, for instance, STEJSKAL E. O. and TANNER J. E. "Spin Diffusion Measurements: Spin Echoes in the Presence of Time-Dependent Field Gradient" in J. Chem. Phys. 42 (1965) 288: page 290, top of the right-hand column:

$$b=\gamma^2 G^2 \delta^2 (\Delta - \delta/3), \quad (1)$$

where G is the amplitude of the gradient pulse, δ the duration of the gradient pulse and Δ the time lag between the consecutive gradient pulses. γ is the gyromagnetic ratio for the hydrogen proton. Gδ describes the factor triggered by the gradient pulse. Lower amplitudes of the gradient pulse can therefore be compensated for (where the b value remains the same) by a longer duration of the gradient pulse.

FIG. 3 (left) illustrates aspects relating to the use of different echo times to acquire various MR data, which corresponds to the different b values. Here the echo time 302 is changed as a function of the encoded b value 301.

It can be seen from FIG. 3 that there can be different qualitative relationships between the echo time 302 and the b value 301 (shown in FIG. 3 by the continuous, dashed and dashed-dotted line). For example, longer (shorter) echo times can be used for higher (lower) b values 301.

In FIG. 3 the qualitative change in the echo time 302 is shown as a function of the b value 301. Different quantitative relationships between the echo time 302 and the b value 301 are conceivable. For example, the minimum echo time 302 (for low b values 301) can amount to from 70%-95% of the maximum echo time 302 (for high b values 301).

In FIG. 3 (right) further aspects are shown relating to the selection of the amplitude of the diffusion-encoding gradient pulses as a function of the echo time 302, for three exemplary b values 301. For longer echo times 302, a lower amplitude 421 can be selected, with higher b values requiring higher amplitudes 421.

For example, in various embodiments, it can be achieved through targeted and selective extension of the echo time 302 that a specific (with respect to the concomitant field terms critical) threshold value amplitude 421A is not exceeded. At the same time, the echo time 302 is selected to be as short as possible in order to maximize the signal strength of the MR data.

FIG. 4 is a sequence diagram, which illustrates a diffusion-encoded MR scanning sequence 400. FIG. 4 shows an RF transmitting and receiving channel 491. It further shows a gradient channel 492, for example, in the phase coding direction.

The MR scanning sequence 400 includes an RF excitation pulse 401 that is radiated to excite nuclear magnetization in the examination region 101A. For example, the RF excitation pulse 401 can excite nuclear magnetization in a specific slice of the examination region 101A; for this purpose a slice-selection gradient pulse can be used (not shown in FIG. 4). In further examples, the RF excitation pulse 401 could excite nuclear magnetization simultaneously in a number of slices in the examination region 101A, for example, in 2 or 3 or 4 slices. This can be implemented for example, by SMS MR imaging.

In conjunction with the radiation of the RF excitation pulse 401, the application of a diffusion module 402 ensues. The diffusion module 402 serves for diffusion encoding. For example, the diffusion module 402 can include the radiation of one or a number of RF refocusing pulses (not shown in FIG. 4). For example, the diffusion module 402 can include the application of diffusion-encoding gradient pulses to the nuclear magnetization excited by the RF excitation pulse 401 (not shown in FIG. 4). Different techniques can be used for the diffusion encoding. For example, a Stejskal-Tanner diffusion encoding or a dual bipolar diffusion encoding can be used.

A read-out module 403 is subsequently used. The read-out module 403 includes the acquisition of MR data 211-213 for the nuclear magnetization excited by the RF excitation pulse 401. For example, the read-out module 403 can form spin echoes by means of TSE techniques. It would also be possible for gradient echoes to be formed by means of EPI-techniques, that is, for an EPI technique to be used.

An example of a specific EPI technique that can be used in the context of the read-out module 403 is simultaneous echo refocusing, SER, see FEINBERG D. A. et al., "Simultaneous Echo Refocusing in EPI" in Magn. Reson. Med. 48 (2002) 1-5, the corresponding disclosure content thereof being incorporated as a cross reference here. It involves an individual gradient pulse train generating gradient echoes sequentially in at least two 2 slices from the examination region 101A. This is achieved by time-delayed phase characteristics of the nuclear magnetization in the at least two 2 slices. In SER slice-selective RF excitation, pulses are used for all the slices that are irradiated sequentially.

With the readout module 401, k-space is sampled (acquired MR data are entered therein at respective points in k-space). The time lag between sampling the center of k-space and radiating the RF-pulse 401 is equal to the echo time 302.

FIG. 5 illustrates an exemplary implementation of the diffusion module 402. The diffusion module 402 according to FIG. 5 is equivalent to a Stejskal-Tanner diffusion encoding. Two monopolar gradient pulses 411,412, which adjacently encompass an RF refocusing pulse 410, are used. The RF refocusing pulse 410 is radiated for half the echo time 302A. FIG. 5 shows the amplitude 421, the duration 422 and the time interval 423 between the gradient pulses 411,412. It is evident from FIG. 5 that by lengthening the echo time 302 or the half echo time 302A, the duration 422 of the gradient pulses 411,412 can be lengthened; as a result, while the factor remains constant, the amplitude 421 can be reduced (see also FIG. 3).

Figure 6:
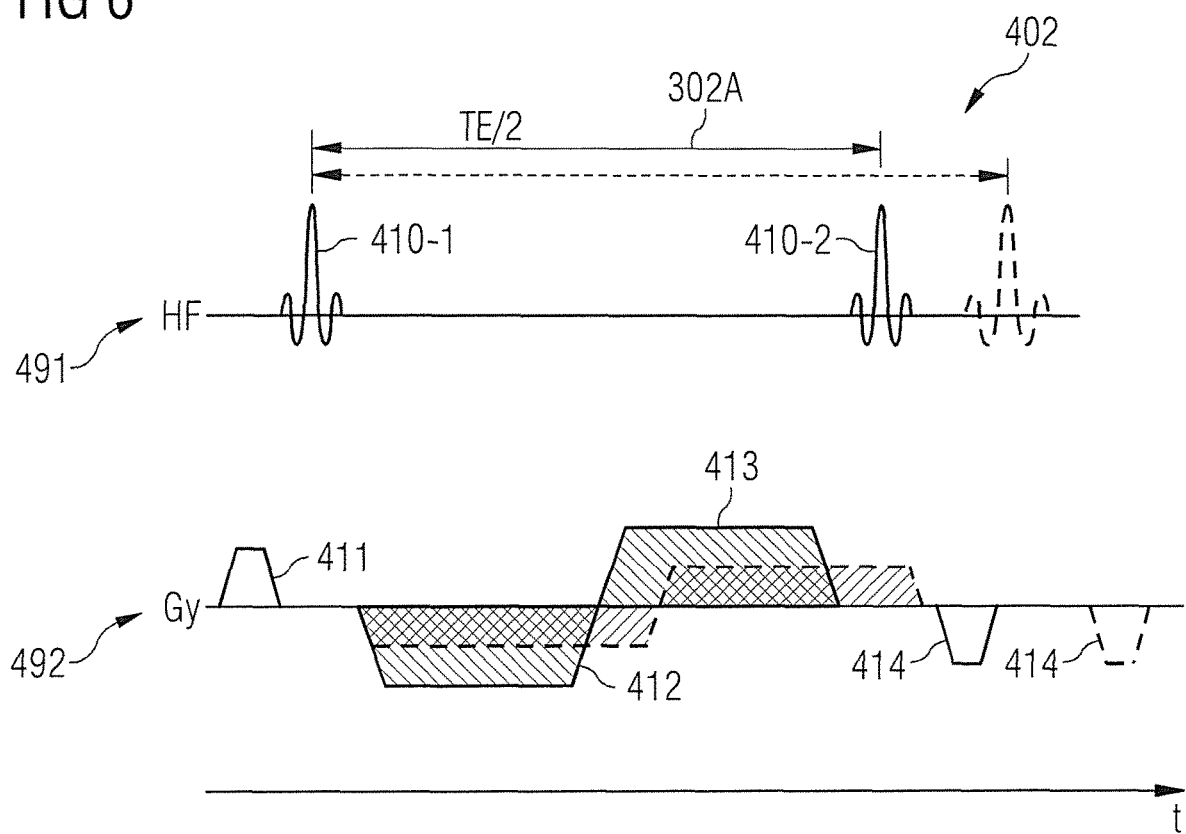
FIG. 6 is a sequence diagram that illustrates the diffusion encoding module according to various embodiments of the invention, with dual bipolar diffusion encoding.

FIG. 6 illustrates a further example of an implementation of the diffusion module 402. The diffusion module 402 according to FIG. 6 is equivalent to dual bipolar diffusion encoding. This involves using two positive gradient pulses 411,413 and two negative gradient pulses 412,414 for the diffusion encoding. Two refocusing pulses 410-1, 410-2 are also radiated with a time delay that corresponds to the half echo time 302A, see REESE T. et al., "Reduction of eddy-current-induced distortion in diffusion MRI using a twice-refocused spin echo" in Magn. Reson. Med. 49 (2003) 177-182: FIG. 1.

FIG. 6 shows the gradient pulses 412, 413 for a specific factor—that is, a specific b value, see equation 1—for a short echo time 302 (continuous line) and a long echo time 302 (dotted line). It is evident that the amplitude 421 of the gradient pulses 412, 413 can be reduced for the extended echo time 302; yet the area below the gradient curves (shown with a dotted line in FIG. 6), that is, the factor of the gradient pulses 412,413, remains constant. This means that the same b value is encoded by the gradient pulses 412, 413. By reducing the amplitude 421 of the gradient pulses 412, 413, the strength of the concomitant field terms can be reduced.

Figure 7:
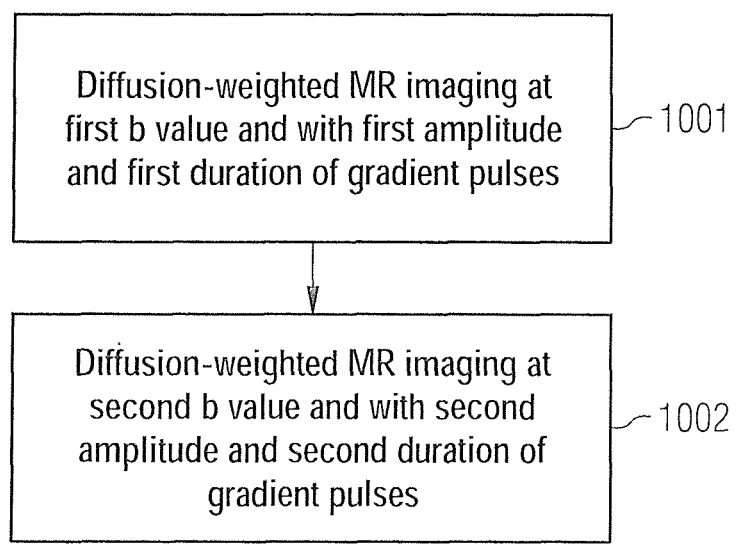
FIG. 7 is a flowchart of the inventive method according to various embodiments.

FIG. 7 is a flowchart of the method according to various embodiments. First, in step 1001, the diffusion-weighted MR imaging ensues with a first b value. Here the diffusion production uses diffusion-weighted gradient pulses occurring at a first amplitude 412 and a first duration 422. Subsequently, in step 1002, the diffusion-weighted MR imaging ensues at a second b value, that differs from the first b value. Here the diffusion production using diffusion-weighted gradient pulses ensues at a second amplitude 412 and a second duration 422; the first and second gradient pulses differ both in their amplitude 412, and in their duration 422.

In various examples, it is possible for a different echo time 302 to be selected for the MR imaging in step 1001 than that used for the MR imaging in step 1002.

Figure 8:
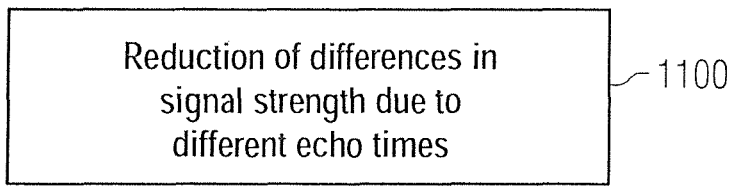
FIG. 8 is a flowchart of the inventive method according to various further embodiments.

FIG. 8 is a flowchart of the method according to various further embodiments. In particular, FIG. 8 illustrates techniques for reducing differences in the signal strength of the MR data 211-213 based on different echo times 302, with which the MR data 211-213 is acquired for different b values.

A compensation factor can be calculated as follows:

$$x = \exp((TE_1 - TE_2)/T2), \qquad (2)$$

where TE1 denotes a first echo time 302, TE2 a second echo time 302, and T2 the relaxation time. The compensation factor can be multiplied by the signal amplitude in the MR data, in order to carry out the reduction in the differences in the signal strength due to the different echo times 302.

In examples, the relaxation time T2 can be predetermined. In other examples, the relaxation time T2 can be determined, for example, on the basis of reference MR measurements that are carried out at different echo times 302.

Basically, the compensation factor can be calculated in different ways for various pixels and/or for various slices from the examination region 101A. In this way a spatially resolved reduction in the differences in the signal strength, that is, adjusted to the local relaxation time T2, can ensue.

In summary, the aforementioned explains techniques make it possible to acquire diffusion-encoded MR data at different b values with different echo times. This makes it possible to select a comparatively low amplitude for the diffusion-encoding gradient pulses, in particular for high b values. As a result thereof, concomitant field terms that lead to deviations from a linear form in the gradient fields triggered by the diffusion-encoding gradient pulses can be reduced. Phase errors in the MR data can therefore be avoided and the quality of the MR imaging can be increased.

The aforementioned techniques can be used in particular for dual bipolar diffusion encoding, which is used for example, in conjunction with SMS EPI techniques. The need to apply slice-specific correction factors is obviated.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for diffusion-weighted magnetic resonance imaging, comprising:
    operating a magnetic resonance data acquisition scanner to activate a first radio frequency (RF) excitation pulse that excites magnetization of nuclear spins in an examination region of a subject;
    operating said magnetic resonance data acquisition scanner to activate first diffusion-coding gradient pulses that act on the magnetization of nuclear spins excited by the first RF excitation pulse, said first diffusion-coding gradient pulses having a first amplitude and a first duration;
    operating the magnetic resonance data acquisition scanner to acquire first magnetic resonance data produced by the magnetization of nuclear spins excited by the first RF excitation pulse during a first echo time produced by said first RF excitation pulse;
    operating the magnetic resonance data acquisition scanner to radiate said first RF excitation pulse and a second RF excitation pulse that excites magnetization of nuclear spins in said examination region;
    operating the magnetic resonance data acquisition scanner to activate second diffusion-coding gradient pulses that act on the magnetization of nuclear spins excited by the second RF excitation pulse, said second diffusion-coding gradient pulses having a second amplitude that differs from the first amplitude and a second duration that differs from the first duration;
    operating the magnetic resonance data acquisition scanner to acquire second magnetic resonance data produced by the magnetization of nuclear spins excited by the second RF excitation pulse during a second echo time produced by said second RF excitation pulse, said second echo time differing from said first echo time; and
    in a computer, reconstructing a diffusion-weighted magnetic resonance image from said first magnetic resonance data and said second magnetic resonance data, and making said diffusion-weighted magnetic resonance image available from the computer in electronic form as a data file,
    wherein operating said magnetic resonance data acquisition scanner includes radiating said first radio frequency excitation pulse and said second radio frequency excitation pulse so as to each excite said magnetization of nuclear spins simultaneously in a set of a plurality of slices of said examination region, and
    wherein said first magnetic resonance data and said second magnetic resonance data are acquired simultaneously from the set of said plurality of slices of said examination region.

2. A method as claimed in claim 1, comprising:
    operating said magnetic resonance data acquisition scanner to activate said first diffusion-coding gradient pulses so as to produce a first b value and to activate said second diffusion-coding gradient pulses to produce a second b value that differs from said first b value.

3. A method as claimed in claim 1, comprising:
    operating the magnetic resonance data acquisition scanner to cause said first echo time to be shorter than said second echo time; and
    operating the magnetic resonance data acquisition scanner to activate said first diffusion-coding gradient pulses to produce a first b value and activating said second diffusion-coding gradient pulses to produce a second b value that is higher than said first b value.

4. A method as claimed in claim 3, comprising:
    operating said magnetic resonance data acquisition scanner to cause said first echo time to be in a range between 70% and 95% of said second echo time.

5. A method as claimed in claim 3, comprising:
    operating said magnetic resonance data acquisition scanner to cause said first echo time to be in a range between 80% and 90% of said second echo time.

6. A method as claimed in claim 1, comprising:
    operating the magnetic resonance data acquisition scanner to acquire said first magnetic resonance data during a first echo time produced by said first RF excitation pulse;
    operating the magnetic resonance data acquisition scanner to acquire said second magnetic resonance data during a second echo time produced by said second RF excitation pulse, said second echo time differing from said first echo time and thereby causing a difference in signal strength between said first magnetic resonance data and said second magnetic resonance data; and
    in said computer, executing a compensation measure that counters said difference.

7. A method as claimed in claim 6, wherein said reduction is dependent on a ratio between a difference between said first echo time and said second echo time, and a relaxation time of said magnetization of said nuclear spins.

8. A method as claimed in claim 7, comprising:
    predetermining said relaxation time in said computer.

9. A method as claimed in claim 7, comprising:
    defining said relaxation time in said computer dependent on reference magnetic resonance measurements made at different echo times.

10. A method as claimed in claim 6, comprising:
    reducing said difference slice-specifically for a plurality of slices in said examination region.

11. A method as claimed in claim 6, comprising:
    reducing said differences in a spatially-resolved manner for different positions in said examination region.

12. A method as claimed in claim 1, comprising:
operating the magnetic resonance data acquisition scanner to activate said first diffusion-coding gradient pulses so as to include two positive gradient pulses and two negative gradient pulses; and
operating said magnetic resonance data acquisition scanner to activate said second diffusion-coding gradient pulses so as to include two positive gradient pulses and two negative gradient pulses.

13. A method as claimed in claim 1, comprising:
operating said magnetic resonance data acquisition scanner to cause said first diffusion-coding gradient pulses and said second diffusion-coding gradient pulses to trigger Stejskal-Tanner diffusion coding or a dual-bipolar diffusion coding.

14. A magnetic resonance apparatus comprising:
a magnetic resonance data acquisition scanner;
a computer configured to operate said magnetic resonance data acquisition scanner to activate a first radio frequency (RF) excitation pulse that excites magnetization of nuclear spins in an examination region of a subject;
said computer configured to operate said magnetic resonance data acquisition scanner to activate first diffusion-coding gradient pulses that act on the magnetization of nuclear spins excited by the first excitation pulse, said first diffusion-coding gradient pulses having a first amplitude and a first duration;
said computer configured to operate the magnetic resonance data acquisition scanner to acquire first magnetic resonance data produced by the magnetization of nuclear spins excited by the first RF excitation pulse during a first echo time produced by said first RF excitation pulse;
said computer configured to operate the magnetic resonance data acquisition scanner to radiate a second RF excitation pulse that excites magnetization of nuclear spins in said examination region during a second echo time produced by said second RF excitation pulse, said second echo time differing from said first echo time;
said computer configured to operate the magnetic resonance data acquisition scanner to activate second diffusion-coding gradient pulses that act on the magnetization of nuclear spins excited by the second RF excitation pulse, said second diffusion-coding gradient pulses having a second amplitude that differs from the first amplitude and a second duration that differs from the first duration;
said computer configured to operate the magnetic resonance data acquisition scanner to acquire second magnetic resonance data produced by the magnetization of nuclear spins excited by the second RF excitation pulse; and
said computer being configured to reconstruct a diffusion-weighted magnetic resonance image from said first magnetic resonance data and said second magnetic resonance data, and to make said diffusion-weighted magnetic resonance image available from the computer in electronic form as a data file,
wherein operating said magnetic resonance data acquisition scanner includes radiating said first radio frequency excitation pulse and said second radio frequency excitation pulse so as to each excite said magnetization of nuclear spins simultaneously in a set of a plurality of slices of said examination region, and
wherein said first magnetic resonance data and said second magnetic resonance data are acquired simultaneously from the set of said plurality of slices of said examination region.

15. A non-transitory, computer-readable data storage medium encoded with programming instructions, said storage medium being loaded into a computer system of a magnetic resonance apparatus that comprises a magnetic resonance data acquisition scanner, and said programming instructions causing said computer system to:
operate a magnetic resonance data acquisition scanner to activate a first radio frequency (RF) excitation pulse that excites magnetization of nuclear spins in an examination region of a subject;
operate said magnetic resonance data acquisition scanner to activate first diffusion-coding gradient pulses that act on the magnetization of nuclear spins excited by the first excitation pulse, said first diffusion-coding gradient pulses having a first amplitude and a first duration;
operate the magnetic resonance data acquisition scanner to acquire first magnetic resonance data produced by the magnetization of nuclear spins excited by the first RF excitation pulse during a first echo time produced by said first RF excitation pulse;
operate the magnetic resonance data acquisition scanner to radiate a second RF excitation pulse that excites magnetization of nuclear spins in said examination region;
operate the magnetic resonance data acquisition scanner to activate second diffusion-coding gradient pulses that act on the magnetization of nuclear spins excited by the second RF excitation pulse, said second diffusion-coding gradient pulses having a second amplitude that differs from the first amplitude and a second duration that differs from the first duration;
operate the magnetic resonance data acquisition scanner to acquire second magnetic resonance data produced by the magnetization of nuclear spins excited by the second RF excitation pulse during a second echo time produced by said second RF excitation pulse, said second echo time differing from said first echo time; and
reconstruct a diffusion-weighted magnetic resonance image from said first magnetic resonance data and said second magnetic resonance data, and make said diffusion-weighted magnetic resonance image available from the computer in electronic form as a data file,
wherein operating said magnetic resonance data acquisition scanner includes radiating said first radio frequency excitation pulse and said second radio frequency excitation pulse so as to each excite said magnetization of nuclear spins simultaneously in a set of a plurality of slices of said examination region, and
wherein said first magnetic resonance data and said second magnetic resonance data are acquired simultaneously from the set of said plurality of slices of said examination region.

16. A method as claimed in claim 1, wherein the magnetization of nuclear spins are excited simultaneously in the plurality of slices of the examination region and the first magnetic resonance data and the second magnetic resonance data are acquired simultaneously from the plurality of slices of the examination region in accordance with a simultaneous multi-slice (SMS) magnetic resonance imaging process.

17. A method as claimed in claim 16, wherein the SMS magnetic resonance imaging process is performed without application of slice-specific correction factors.

\* \* \* \* \*